(12) United States Patent
Liu et al.

(10) Patent No.: US 12,604,621 B2
(45) Date of Patent: Apr. 14, 2026

(54) DISPLAY PANEL AND DISPLAY DEVICE

(71) Applicants:Hefei Xinsheng Optoelectronics Technology Co., Ltd., Hefei (CN); BOE Technology Group Co., Ltd., Beijing (CN)

(72) Inventors: Ning Liu, Beijing (CN); Ming Wang, Beijing (CN); Bin Zhou, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 378 days.

(21) Appl. No.: 18/032,281

(22) PCT Filed: Jun. 21, 2022

(86) PCT No.: PCT/CN2022/100119
§ 371 (c)(1),
(2) Date: Apr. 17, 2023

(87) PCT Pub. No.: WO2023/245414
PCT Pub. Date: Dec. 28, 2023

(65) Prior Publication Data
US 2025/0126986 A1 Apr. 17, 2025

(51) Int. Cl.
*H10K 59/131* (2023.01)
*H10K 59/121* (2023.01)
(Continued)

(52) U.S. Cl.
CPC ....... *H10K 59/131* (2023.02); *H10K 59/1213* (2023.02); *H10K 59/126* (2023.02); *H10K 59/80516* (2023.02); *H10K 2102/351* (2023.02)

(58) Field of Classification Search
None
See application file for complete search history.

(56) References Cited

U.S. PATENT DOCUMENTS

2005/0012454 A1 1/2005 Yamazaki et al.
2006/0022219 A1* 2/2006 Humbs .................. H10K 59/12
257/211
(Continued)

FOREIGN PATENT DOCUMENTS

CN 109103215 A 12/2018
CN 111211243 A 5/2020
(Continued)

*Primary Examiner* — Michael Lebentritt
(74) *Attorney, Agent, or Firm* — IPro, PLLC

(57) ABSTRACT
Provided is a display panel, including: a substrate; an auxiliary electrode on a side of the substrate; an insulating layer on a side, distal from the substrate, of the auxiliary electrode and a first via running through the insulating layer, the first via exposing the auxiliary electrode and being in an undercut shape; an anode layer on a side, distal from the substrate, of the insulating layer; a light emitting layer on a side, distal from the substrate, of the anode layer, the light emitting layer being broken at an opening in a side, distal from the substrate, of the first via into a first part and a second part; and a cathode layer on a side, distal from the substrate, of the light emitting layer, the cathode layer being coupled with the auxiliary electrode along a side wall of the first part of the light emitting layer.

20 Claims, 9 Drawing Sheets

(51) Int. Cl.
_H10K 59/126_ (2023.01)
_H10K 59/80_ (2023.01)
_H10K 102/00_ (2023.01)

(56) References Cited

U.S. PATENT DOCUMENTS

| | | | |
|---|---|---|---|
| 2019/0229152 A1 | 7/2019 | Wang | |
| 2020/0176541 A1* | 6/2020 | Xu ........................ | H10K 50/824 |
| 2021/0376283 A1* | 12/2021 | Shin ..................... | H10K 59/124 |
| 2023/0157133 A1 | 5/2023 | Wang et al. | |

FOREIGN PATENT DOCUMENTS

| | | | | | |
|---|---|---|---|---|---|
| CN | 111312923 | A | | 6/2020 | |
| CN | 113130821 | A | | 7/2021 | |
| CN | 113629121 | A | | 11/2021 | |
| CN | 114284458 | A | | 4/2022 | |
| CN | 116897311 | A | * 10/2023 | ........... | H10K 59/805 |
| CN | 117202711 | A | * 12/2023 | | |
| CN | 117643197 | A | * 3/2024 | ....... | H10K 59/80522 |
| CN | 117979748 | A | * 5/2024 | ........... | H10K 50/813 |
| CN | 118660505 | A | * 9/2024 | ......... | H10K 59/8794 |
| CN | 118660538 | A | * 9/2024 | ............ | H10K 71/10 |
| WO | WO-2022222070 | A1 | * 10/2022 | ....... | H10K 59/80517 |
| WO | WO-2022222078 | A1 | * 10/2022 | ......... | H10K 59/1315 |
| WO | WO-2022222084 | A1 | * 10/2022 | ......... | H10K 59/1315 |
| WO | WO-2023159554 | A1 | * 8/2023 | ............ | H10K 59/00 |

* cited by examiner

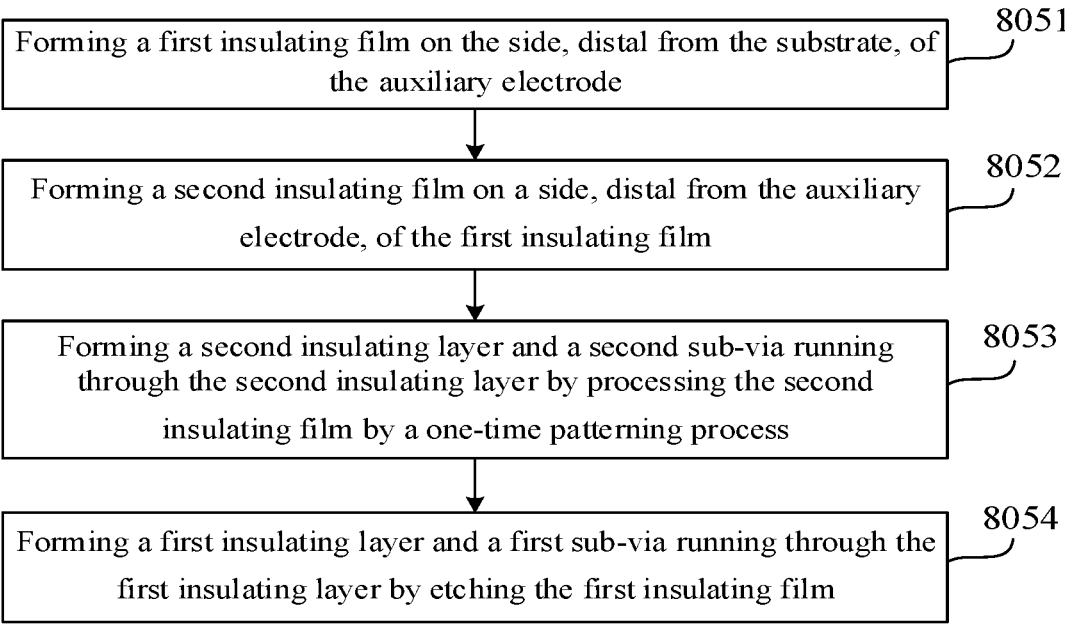

| Forming a first insulating film on the side, distal from the substrate, of the auxiliary electrode | 8051 |

| Forming a second insulating film on a side, distal from the auxiliary electrode, of the first insulating film | 8052 |

| Forming a second insulating layer and a second sub-via running through the second insulating layer by processing the second insulating film by a one-time patterning process | 8053 |

| Forming a first insulating layer and a first sub-via running through the first insulating layer by etching the first insulating film | 8054 |

FIG. 13

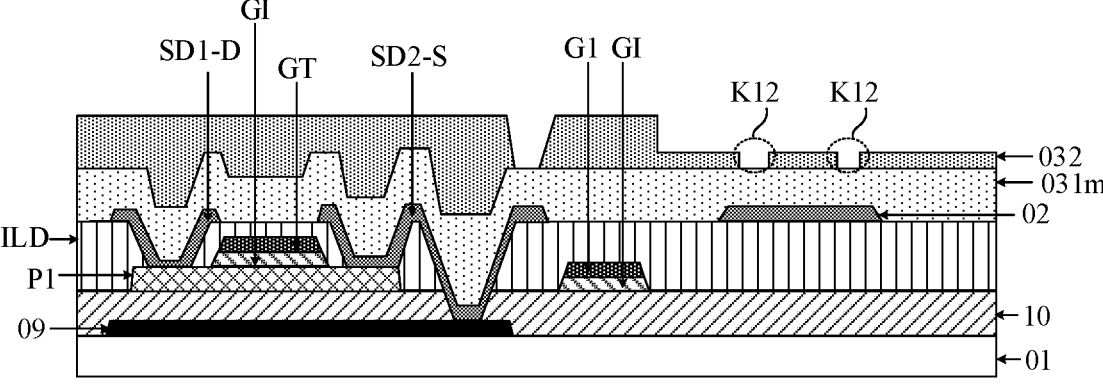

FIG. 14

DISPLAY PANEL AND DISPLAY DEVICE

CROSS-REFERENCE TO RELATED APPLICATION

The present disclosure is a U.S. national stage of international application No. PCT/CN2022/100119, filed on Jun. 21, 2022, the content of which is herein incorporated by reference in its entirety.

TECHNICAL FIELD

The present disclosure relates to the field of display technologies, and in particular, relates to a display panel and a display device.

BACKGROUND OF THE INVENTION

Organic light emitting diode (OLED) display panels have been extensively studied in recent years due to their advantages of self-illumination, wide viewing angle, and fast response.

SUMMARY OF THE INVENTION

Embodiments of the present disclosure provide a display panel and a display device. The technical solutions are as follows:

According to one aspect of some embodiments of the present disclosure, a display panel is provided. The display panel includes:

a substrate;

an auxiliary electrode on a side of the substrate;

an insulating layer on a side, distal from the substrate, of the auxiliary electrode and a first via running through the insulating layer, wherein the first via exposes the auxiliary electrode and is in an undercut shape;

an anode layer on a side, distal from the substrate, of the insulating layer;

a light emitting layer on a side, distal from the substrate, of the anode layer, the light emitting layer being broken at an opening in a side, distal from the substrate, of the first via into a first part and a second part, wherein the first part is outside the first via and on the side, distal from the substrate, of the insulating layer, and the second part is inside the first via and on a side, proximal to the substrate, of the insulating layer; and a cathode layer on a side, distal from the substrate, of the light emitting layer, wherein the cathode layer is coupled with the auxiliary electrode along a side wall of the first part of the light emitting layer, and the coupled part of the cathode layer and the auxiliary electrode is on a side, proximal to the substrate, of the anode layer.

In some embodiments, the insulating layer includes a first insulating layer and a second insulating layer that are laminated in sequence along a direction away from the substrate;

the first via in the undercut shape includes a first sub-via running through the first insulating layer and a second sub-via running through the second insulating layer, wherein the first sub-via and the second sub-via are communicated in sequence along the direction away from the substrate; and an orthographic projection of an opening in a side, proximal to the substrate, of the first sub-via on the substrate and an orthographic projection of an opening in a side, proximal to the substrate, of the second sub-via on the substrate are both within an orthographic projection of an opening in a side, distal from the substrate, of the first sub-via on the substrate.

In some embodiments, a thickness of the first insulating layer is greater than a thickness of the anode layer and less than or equal to a thickness of the second insulating layer.

In some embodiments, the thickness of the first insulating layer is 0.5 times to 1 time the thickness of the second insulating layer.

In some embodiments, a slope of a side wall of the first sub-via is larger than a slope of a side wall of the second sub-via.

In some embodiments, along a direction perpendicular to the substrate, a cross-section of the first sub-via is of an inverted trapezoid shape, and a cross-section of the second sub-via is of a rectangle shape.

In some embodiments, the first insulating layer includes a passivation layer, and the second insulating layer includes a resin material layer.

In some embodiments, the display panel includes one first via running through the insulating layer, or a plurality of first vias running through the insulating layer, wherein a direction in which the plurality of first vias are arranged at intervals is a direction parallel to a bearing surface of the substrate.

In some embodiments, the display panel further includes:

a first conductive layer between the insulating layer and the light emitting layer, wherein the cathode layer is coupled with the first conductive layer along the side wall of the first part of the light emitting layer, the first conductive layer is coupled with the auxiliary electrode along a side wall of the first via and a bottom of the first via, and the coupled part of the cathode layer and the first conductive layer is on the side, proximal to the substrate, of the anode layer.

In some embodiments, the anode layer includes a second conductive layer, a reflective anode layer, and a third conductive layer that are laminated in sequence along the direction away from the substrate;

wherein the second conductive layer and the first conductive layer are disposed on the same layer and spaced apart from each other.

In some embodiments, the display panel further includes:

a transistor between the substrate and the insulating layer, the transistor being provided with an active layer, a gate insulating layer, a gate metal layer, an inter-layer dielectric layer, and a source-drain metal layer that are laminated in sequence, wherein the source-drain metal layer and the auxiliary electrode are disposed on the same layer, and the source-drain metal layer includes a first metal part and a second metal part that are disposed on the same layer and spaced apart from each other;

a second via running through the insulating layer and exposing the second metal part, wherein the second conductive layer in the anode layer is coupled with the second metal part by the second via; and a third via running through the inter-layer dielectric layer and exposing the active layer, wherein the first metal part and the second metal part are both coupled with the active layer by the third via.

In some embodiments, a width of the first via is greater than a width of the second via.

In some embodiments, the active layer, the gate insulating layer, the gate metal layer, the inter-layer dielectric layer, and the source-drain metal layer are laminated in sequence along the direction away from the substrate; and the display panel further includes:

a light shielding layer and a buffering layer that are laminated in sequence along the direction away from the substrate between the substrate and the transistor; and a fourth via running through the inter-layer dielectric layer and the buffering layer and exposing the light shielding layer, wherein the second metal part is coupled with the light shielding layer by the fourth via.

In some embodiments, the display panel further includes a pixel defining layer disposed between the insulating layer and the light emitting layer, and the substrate includes a first region and a second region, wherein the first region and the second region are defined by the pixel defining layer, the second region at least partially surrounding the first region;

the light shielding layer, the transistor, the anode layer, the pixel defining layer, the second via, the third via and the fourth via are all disposed in the first region;

the auxiliary electrode, the first conductive layer, and the first via are all disposed in the second region;

the buffering layer, the inter-layer dielectric layer, the insulating layer, the light emitting layer, and the cathode layer are all disposed in the first region and the second region, and a thickness of a part of the insulating layer disposed in the first region is greater than a thickness of a part of the insulating layer disposed in the second region; and the anode layer, the light emitting layer, and the cathode layer in the first region form an organic light emitting diode.

According to another aspect of some embodiments of the present disclosure, a display device is provided. The display device includes a power component, and the display panel as described in the above aspect;

wherein the power component is electrically connected to the display panel, and is configured to supply power to the display panel.

BRIEF DESCRIPTION OF DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

FIG. 13 is a flowchart of a method for forming an insulating layer and a first via according to some embodiments of the present disclosure;

FIG. 14 is a schematic structural diagram of some film layers in yet still another display panel according to some embodiments t of the present disclosure;

DETAILED DESCRIPTION

For clearer descriptions of the objectives, technical solutions, and advantages of the present disclosure, embodiments of the present disclosure are described in detail hereinafter with reference to the accompanying drawings.

Currently, depending on light emitting surfaces, OLED display panels may be classified into bottom-emission OLED display panels and top-emission OLED display panels. Depending on light transmittance, OLED display panels may be classified into transparent OLED display panels and non-transparent conventional OLED display panels. The top-emission transparent OLED display panel has received more and more attention from the market due to a larger aperture ratio and clear image quality. Moreover, for large-sized top-emission transparent OLED display panels, for better light transmission effect and light transmittance, the cathode layer disposed therein is large and thin, that is, larger in size and smaller in thickness.

However, the relatively thin cathode layer generally has the problem of high resistance value and large voltage drop (IR drop). The larger the size of the cathode layer, the more obvious the voltage drop. In this way, the display panel is poor in display uniformity.

Figure 1:
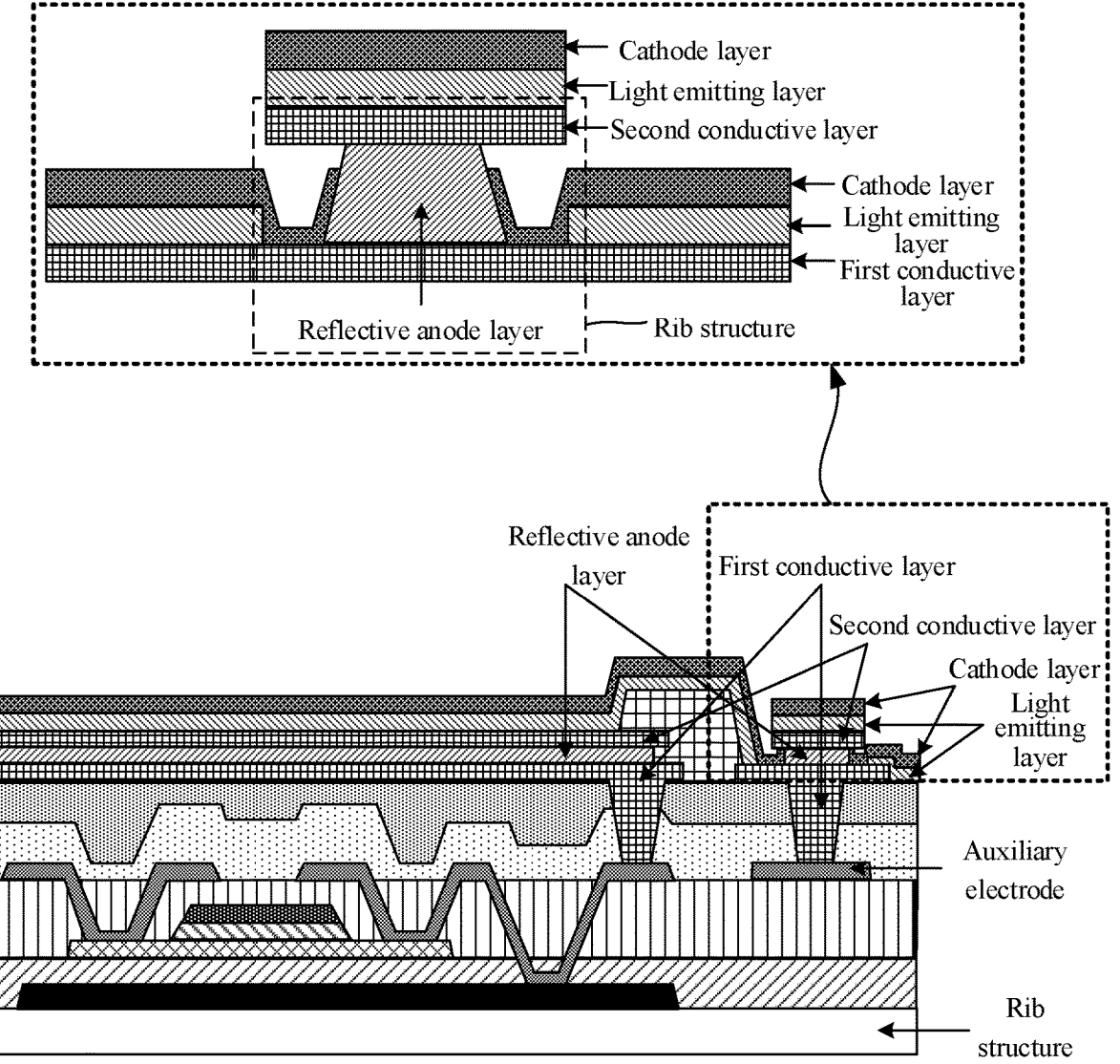
FIG. 1 is a schematic structural diagram of a display panel in some practices.

As described above, in large-scale transparent display products (such as top-emission OLED display panels), the cathode layer (also referred to as cathode) is usually relatively thin to increase light transmittance and achieve better transparent display. However, the relatively thin cathode has the problem of larger voltage drop (IR drop), resulting in poor display effect of the display panel. For this reason, it is possible to slow down the voltage drop (IR drop) by adding an auxiliary electrode (also referred to as an auxiliary cathode) to be coupled with the cathode. With reference to FIG. 1, the current common coupling method is to prepare an "I"-shaped barrier layer (rib) structure on a side, distal from the substrate, of the auxiliary electrode, so as to cut off a light emitting material (i.e., a light emitting layer) formed by an evaporation process by virtue of a tip angle protruding from a side, distal from the substrate, of the rib structure, such that the cathode layer on a side, distal from the substrate, of the light emitting layer is coupled with the auxiliary electrode.

With reference to the enlarged view shown in FIG. 1, the current "I"-shaped rib structure needs to be formed together with a reflective anode layer in an anode layer (also referred to as anode). Specifically, the rib structure includes a first conductive layer, a reflective anode layer, and a second conductive layer. The first conductive layer, the reflective anode layer, and the second conductive layer may be configured to form the anode layer. With reference to the partial enlarged view of FIG. 1, the light emitting layer may be cut off by the "I"-shaped rib structure, such that the cathode layer is deposited on a side, distal from the substrate, of the first conductive layer to be indirectly coupled with the auxiliary electrode by the first conductive layer.

However, the preparation method shown in FIG. 1 requires multiple patterning processes, and the preparation process is relatively complicated and the cost is relatively high. The one-time patterning process includes process steps such as photoresist coating, exposure, development, etching and photoresist stripping. Moreover, since the "I"-shaped rib structure needs to reach a certain height value to successfully cut off the light emitting layer, the thickness of the synchronously formed reflective anode layer is relatively thick. The thicker the film layer, the longer it takes to deposit the film layer, which further leads to the generation of a large number of particles during the deposition process. When the light emitting layer is being formed by using an evaporation process subsequently, the light emitting layer may be easily pierced, causing a short circuit between the cathode and the anode and then a large number of defective dark spots on the display panel, resulting in poor product yield and low display quality of the display panel.

Based on the above problems, embodiments of the present disclosure provide a new display panel and a manufacturing method thereof, which greatly simplify the manufacturing process, lower manufacturing costs, and can greatly reduce the thickness of the film layer while effectively reducing the IR drop on the cathode layer, so as to greatly improve the problem of defective dark spots, and improve the product yield and display quality of the display panel.

Figure 2:
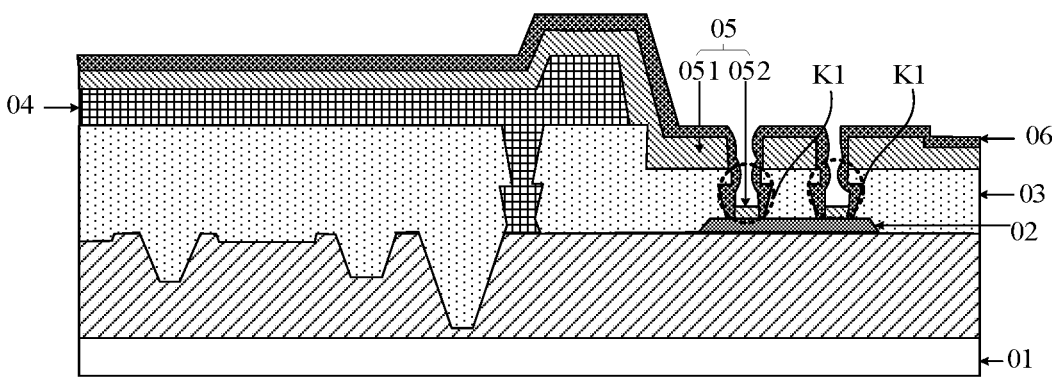
FIG. 2 is a schematic structural diagram of a display panel according to some embodiments of the present disclosure.

FIG. 2 is a schematic structural diagram of a display panel according to some embodiments of the present disclosure. As shown in FIG. 2, the display panel includes:

a substrate 01;

an auxiliary electrode 02 on a side of substrate 01; and an insulating layer 03 on a side, distal from the substrate 01, of the auxiliary electrode 02, and a first via K1 running through the insulating layer 03.

The first via K1 exposes the auxiliary electrode 02 and is in an undercut shape. That is, an orthographic projection of the first via K1 on the substrate 01 overlays with an orthographic projection of the auxiliary electrode 02 on the substrate 01, in which overlaying may refer to overlapping or coinciding. Exemplarily, with reference to FIG. 2, the orthographic projection of the first via K1 on the substrate 01 is within the orthographic projection of the auxiliary electrode 02 on the substrate 01, so as to fully expose the auxiliary electrode 02. With reference to FIG. 2, the undercut shape may mean that a bottom opening in a side, proximal to the substrate 01, of the first via K1 is wider than a top opening in a side distal from the substrate 01, wherein a width direction may refer to a direction parallel to a bearing surface of the substrate 01.

The display panel includes an anode layer 04 on a side, distal from the substrate 01, of the insulating layer; and a light emitting layer 05 on a side, distal from the substrate 01, of the anode layer 04.

Still with reference to FIG. 2, since the first via K1 is in the undercut shape, the light emitting layer 05 is broken at the opening (i.e., the top opening) in the side, distal from the substrate 01, of the first via K1 into a first part 051 and a second part 052. The first part 051 is outside the first via K1 and on the side, distal from the substrate 01, of the insulating layer 03. The second part 052 is inside the first via K1 and on a side, proximal to the substrate 01, of the insulating layer 03. That is, the first part 051 and the second part 052 are not connected to each other, the first part 051 is distal from the substrate 01 relative to the insulating layer 03, the second part 052 is proximal to the substrate 01, and the second part 052 falls into the first via K1.

The display panel includes a cathode layer 06 on a side, distal from the substrate 01, of the light emitting layer 05.

Still with reference to FIG. 2, on the basis that the undercut-shaped first via K1 causes the light emitting layer 05 to be broken into the first part 051 and the second part 052, the cathode layer 06 is effectively coupled with the auxiliary electrode 02 along a side wall of the first part 051 of the light emitting layer 05, and the coupled part of the cathode layer 06 and the auxiliary electrode 02 is on a side, proximal to the substrate 01, of the anode layer 04. That is, the coupled part is more proximal to the substrate 01 relative to the anode layer 04.

In this way, the voltage drop (IR drop) on the cathode layer 06 is effectively reduced by flexibly setting the voltage applied to the auxiliary electrode 02 to ensure better display uniformity of the display panel. This improvement method is more effective for the large and thin cathode layer 06 in a large-size top-emission transparent OLED display panel. Accordingly, the auxiliary electrode 02 may also be referred to as an auxiliary cathode. Coupling may refer to electrical connection.

In summary, the embodiments of the present disclosure provide a display panel. The display panel includes an auxiliary electrode, an insulating layer, an anode layer, a light emitting layer, and a cathode layer that are on a side of a substrate and laminated in sequence. The insulating layer is provided with a via in an undercut shape and exposing the auxiliary electrode. In this way, the light emitting layer is reliably broken into two parts at an opening in a side, distal from the substrate, of the via, and then the cathode layer is effectively coupled with the auxiliary electrode along a side wall of a first part of the light emitting layer. On this basis, the voltage drop on the large and thin cathode layer is effectively reduced by flexibly adjusting the voltage applied to the auxiliary electrode to ensure better display uniformity of the display panel.

In addition, since the light emitting layer is broken by forming a via running through the insulating layer and in the undercut shape to facilitate the coupling of the cathode layer and the auxiliary electrode, it is considered that a rib structure is moved down from the anode layer to the insulating layer. Therefore, the rib structure does not need to be formed on the same layer as the anode layer. On this basis, it not only simplifies the manufacturing process, but also avoids dark spots caused by the thick anode layer as formed. Under the premise of ensuring good display uniformity, it can also ensure good product yield and display quality of the display panel.

Figure 3:
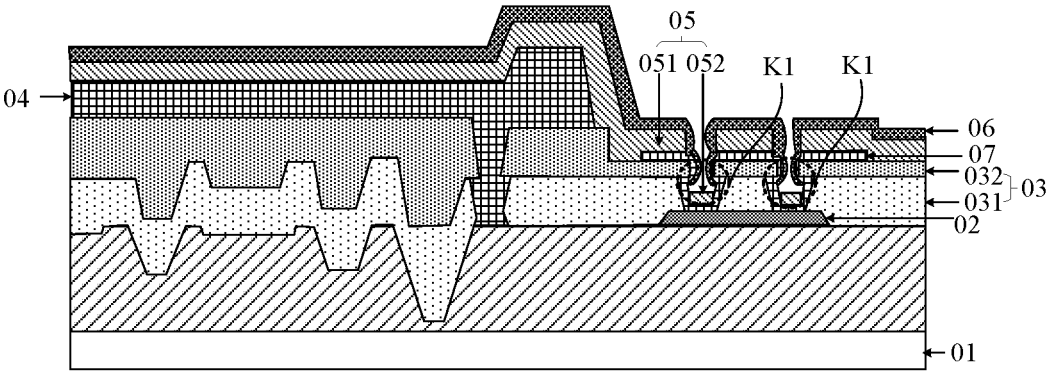
FIG. 3 is a schematic structural diagram of another display panel according to some embodiments of the present disclosure.
Figure 4:
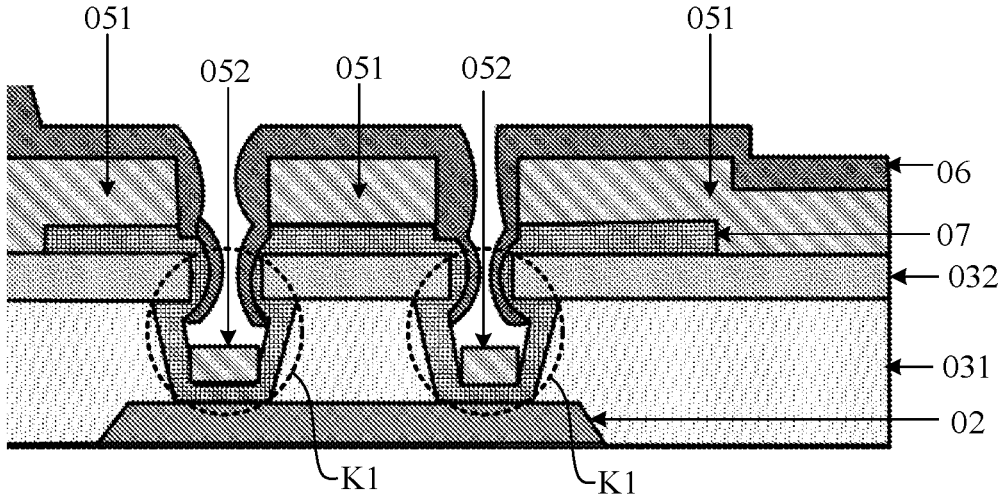
FIG. 4 is a partially enlarged schematic diagram of the display panel shown in FIG. 3.

Optionally, FIG. 3 is a schematic structural diagram of another display panel according to some embodiments of the present disclosure. FIG. 4 is a partially enlarged view of the structure shown in FIG. 3. With reference to FIG. 3 and FIG. 4, the display panel according to the embodiment of the present disclosure may further include a first conductive layer 07 between the insulating layer 03 and the light emitting layer 05.

The cathode layer 06 may be coupled with the first conductive layer 07 along the side wall of the first part 051 of the light emitting layer 05, and the coupled part of the cathode layer 06 and the first conductive layer 07 may be on the side, proximal to the substrate 01, of anode layer 04. That is, the coupled part of the cathode layer 06 and the first conductive layer 07 is more proximal to the substrate 01 relative to the anode layer 04.

The first conductive layer 07 may be coupled with the auxiliary electrode 02 along a side wall and bottom of the first via K1. That is, the first conductive layer 07 may extend along the bottom and side wall of the first via K1 so as to be attached to the bottom and side wall of the first via K1 and reliably coupled with the auxiliary electrode 02. In other words, comparing FIG. 1 and FIG. 3, in the embodiment of the present disclosure, the interior of the first via K1 will not be completely filled by the first conductive layer 07.

Since the bottom of the first via K1 exposes the auxiliary electrode 02, an orthographic projection of a part of the first conductive layer 07 attached to the bottom of the first via K1 on the substrate 01 overlaps with the orthographic projection of the auxiliary electrode 02 on the substrate 01 so as to cover and being coupled with the auxiliary electrode 02. Exemplarily, the orthographic projection of the part of the first conductive layer 07 attached to the bottom of the first via K1 on the substrate 01 is within the orthographic projection of the auxiliary electrode 02 on the substrate 01 as shown. The second part 052 of the light emitting layer 05 broken at the opening of the first via K1 may be inside the first via K1 and on a side of the part of the first conductive layer 07 attached to the bottom, distal from the substrate, of the first via K1 and covers this part of the first conductive layer 07.

On the basis of the above embodiments, the coupling between the cathode layer 06 and the auxiliary electrode 02 according to the embodiment of the present disclosure may also be considered as the cathode layer 06 being indirectly coupled with the auxiliary electrode 02 by the first conductive layer 07.

In some other embodiments, the first conductive layer 07 may be coupled with the auxiliary electrode 02 only along the side wall of the first via K1. In this way, the second part 052 of the light emitting layer 05 may be inside the first via K1 and on a side, distal from the substrate 01, of the exposed part of the auxiliary electrode 02 and cover this part of the auxiliary electrode 02. The way of coupling the first conductive layer 07 and the auxiliary electrode 02 is not limited in the embodiment of the present disclosure.

Figure 5:
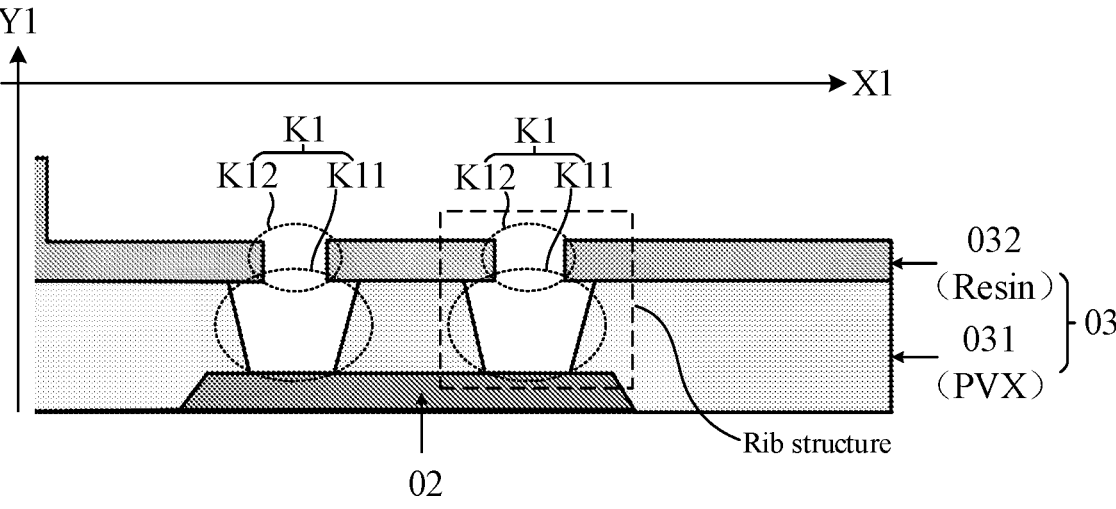
FIG. 5 is another partially enlarged schematic diagram of the display panel shown in FIG. 3.

Optionally, FIG. 5 is another partial enlarged view of the first via K1 in the structure shown in FIG. 3. With reference to FIG. 3 to FIG. 5 that in the embodiments of the present disclosure, the insulating layer 03 may include a first insulating layer 031 and a second insulating layer 032 laminated in sequence along a direction away from the substrate 01. On this basis, the undercut-shaped first via K1 may include a first sub-via K11 running through the first insulating layer 031 and a second sub-via K12 running through the second insulating layer 032, wherein the first sub-via K11 and the second sub-via K12 are communicated in sequence along the direction away from the substrate 01.

Moreover, an orthographic projection of an opening (which may be referred to a bottom opening) in a side, proximal to the substrate 01, of the first sub-via K11 and an orthographic projection of an opening (which may be referred to as a top opening) on a side, proximal to the substrate 01, of the second sub-via K12 on the substrate 01 may be both within an orthographic projection of an opening (which may be referred to as a top opening) in a side, distal from the substrate 01, of the first sub-via K11 on the substrate 01.

Optionally, still with reference to FIG. 5, the first insulating layer 031 may include a passivation layer (PVX). The second insulating layer 032 may include a resin material layer (Resin). That is, in the embodiment of the present disclosure, the formed rib structure may include the passivation layer PVX having the first sub-via K11 and the resin material layer Resin having the second sub-via K12. That is, the rib structure for cutting off the light emitting layer 05 may be moved down to the passivation layer PVX and the resin material layer Resin, and the passivation layer PVX and the resin material layer Resin form the rib structure. In this way, since the rib structure may not be formed on the same layer as the anode layer 04, the process flow is simplified, and the anode layer 04 is avoided from being too thick. That is, the anode layer 04 may be relatively thin. Furthermore, dark spots caused by particles in the anode layer 04 are greatly addressed, such that the product yield of the display panel is enhanced, and the display quality of the display panel is improved. A thickness direction is a direction perpendicular to the substrate 01.

In some other embodiments, the insulating layer 03 may also include only one insulating layer or more than two insulating layers, so as to form the undercut-shaped first via K1 shown in FIGS. 2 to 5, which is not limited in the embodiments of the present disclosure.

Optionally, in the embodiments of the present disclosure, a thickness of the first insulating layer 031 may be greater than a thickness of the anode layer 04. That is, as mentioned in the above embodiments, the anode layer 04 as formed may be relatively thin. The thickness of the first insulating layer 031 may be less than or equal to a thickness of the second insulating layer 032. In this way, with reference to FIG. 4 and FIG. 5, a height of a side wall of the second sub-via K2 as formed may be greater than or equal to a height of a side wall of the first sub-via K1, which ensures that the light emitting layer 05 is reliably broken at the top opening of the first via K1 and the cathode layer 06 on the side, distal from the substrate 01, of the light emitting layer 05 is reliably coupled with the auxiliary electrode 02 by the first via K1. A height direction is the same as the thickness direction.

Exemplarily, the thickness of the first insulating layer 031 may be 0.5 to 1 time the thickness of the second insulating layer 032.

Optionally, a slope of the side wall of the first sub-via K11 may be greater than a slope of the side wall of the second sub-via K12. That is, with reference to FIG. 3 to FIG. 5, a slope of a side, proximal to the first via K1, of the first insulating layer 031 may be greater than a slope of a side, proximal to the first via K1, of the second insulating layer 032.

The slope refers to a ratio of a distance between a vertical height of the side in the direction away from the substrate 01 and a length in a direction parallel to the bearing surface of the substrate 01, which may also be referred to as an inclination of the side in the direction away from the substrate 01. The inclination of the first insulating layer 031 is greater than the inclination of the second insulating layer 032.

Exemplarily, still with reference to FIG. 5, along a direction Y1 perpendicular to the substrate 01 (i.e., the direction away from the substrate 01), a cross-section of the first sub-via K11 may be of an inverted trapezoid shape, and a cross-section of the second sub-via K12 may be of a rectangle shape. That is, the side wall (also referred to as the side, proximal to the first via K1, of the first insulating layer 031) of the first sub-via K11 may gradually expand outward from its bottom to its top, i.e., leaning outward. For the second sub-via K12, its side wall (also referred to as the side, proximal to the first via K1, of the second insulating layer 032) is perpendicular to the bearing surface of the substrate 01, and an extension line thereof along the direction Y1 is inside the first sub-via K11. That is, the side wall of the second sub-via K12 protrudes into the via with a certain length relative to the side wall of the first sub-via K11, and this protruding part may be referred to as a tip angle. This tip angle ensures that the light emitting layer 05 is cut off reliably, and further ensures that the cathode layer 06 is effectively coupled with the auxiliary electrode 02.

In some other embodiments, the first via K1 may include a greater number of sub-vias communicated in sequence to form different undercut shapes, which is not limited in the embodiments of the present disclosure. Optionally, the opening of the first via K1 may be in the shape of a rectangle, a circle, an ellipse, or a polygon.

Optionally, the display panel may include one first via K1 running through the insulating layer 03 or a plurality of first vias K1 running through the insulating layer 03 and arranged at intervals. A direction X1 in which the plurality of first vias K1 are spaced apart may be the direction parallel to the bearing surface of the substrate 01.

Exemplarily, with reference to FIG. 5, the display panel as shown includes two first vias K1 running through the insulating layer 03 and arranged at intervals along the arrangement direction X1 parallel to the bearing surface of the substrate 01.

It should be noted that by providing a large number of first vias K1, reliable coupling of the first conductive layer 07 and the auxiliary electrode 02 is ensured, and reliable coupling of the cathode layer 06 and the auxiliary electrode 02 is thus achieved.

Further, the light emitting layer 05 may be broken into a plurality of first parts 051 and a plurality of second parts 052 on the premise of including a plurality of first vias K1. Exemplarily, with reference to FIG. 4, the light emitting layer 05 is broken into two second parts 052 and three first parts 051 by the top openings of two first vias K1.

Figure 6:
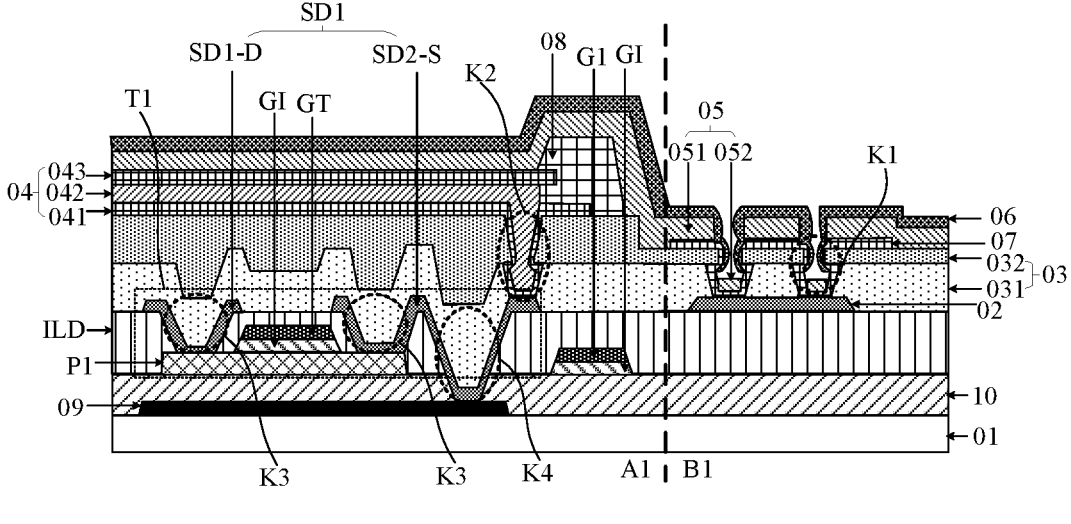
FIG. 6 is a schematic structural diagram of still another display panel according to some embodiments of the present disclosure.

Optionally, FIG. 6 is a schematic structural diagram of another display panel according to some embodiments of the present disclosure. As shown in FIG. 6, the anode layer 04 may include a second conductive layer 041, a reflective anode layer 042, and a third conductive layer 043 that are laminated in sequence along the direction away from the substrate 01.

Moreover, the second conductive layer 041 and the first conductive layer 07 may be disposed on the same layer and spaced apart from each other, and a spacing direction may be parallel to the bearing surface of the substrate 01, which is the direction X1 shown in FIG. 5.

It should be noted that being disposed on the same layer may refer to a layer structure formed by forming a film layer for forming a specific pattern using the same film-forming process and then patterning the film layer by a one-time patterning process using the same mask. Depending on the specific pattern, the one-time patterning process may include multiple exposure, development or etching processes, and the specific pattern in the layer structure as formed may be continuous or discontinuous. That is, a plurality of elements, components, structures and/or parts disposed on the "same layer" are made of the same material and formed through the same patterning process. In this way, the manufacturing process is simplified, the manufacturing cost is reduced, and the manufacturing efficiency is improved. That is, the second conductive layer 041 and the first conductive layer 07 according to the embodiment of the present disclosure may be made of the same material by a one-time patterning process.

Optionally, the first conductive layer 07, the second conductive layer 041 and the third conductive layer 043 may all be made of a transparent conductive material, such as indium tin oxide (ITO). Accordingly, in the embodiment of the present disclosure, the first conductive layer 07 and the second conductive layer 041 disposed on the same layer may be collectively referred to as an ITO1 layer, and the third conductive layer 043 may be referred to as an ITO2 layer.

The reflective anode layer 042 may be configured to reflect light. Accordingly, the display panel according to the embodiment of the present disclosure may be a top-emission display panel. In some other embodiments, the reflective anode layer 042 may not be included, and accordingly, the display panel may be a bottom-emission display panel. The thickness mentioned in the above embodiments may refer to a thickness of the reflective anode layer 042.

Optionally, still with reference to FIG. 6, the display panel may further include a pixel defining layer (PDL) 08 between the insulating layer 03 and the light emitting layer 05. The pixel defining layer 08 may be configured to define a display region and a non-display region.

Optionally, the pixel defining layer 08 may be made of at least one of polymethylmethacrylate and polystyrene-based polymers, phenolic group-based polymers and derivatives, acrylic-based polymers, p-xylene-based polymers, aryl ether-based polymers, amide-based polymers, fluoride-based polymers, p-xylene-based polymers, and vinyl alcohol polymers.

Optionally, still with reference to FIG. 6, the display panel may further include a transistor T1 between the substrate 01 and the insulating layer 03. Moreover, the transistor T1 may be provided with an active layer P1, a gate insulating (GI) layer, a gate metal layer GT, an inter-layer dielectric (ILD) layer, and a source-drain metal (SD) layer that are laminated in sequence.

The source-drain metal layer SD and the auxiliary electrode 02 may be disposed on the same layer. That is, as described in the above embodiment, the source-drain metal layer SD and the auxiliary electrode 02 may be formed by a one-time patterning process using the same material.

Optionally, the source-drain metal layer SD and the auxiliary electrode 02 may be both made of a metal material such as aluminum, silver, molybdenum or alloys thereof.

Due to the strong electrical conductivity of the above metal material, the voltage drop (IR drop) on the cathode layer 06 is effectively reduced.

In addition, the source-drain metal layer SD may include a first metal part SD1 and a second metal part SD2 disposed on the same layer and spaced apart from each other. That is, the first metal part SD1 and the second metal part SD2 may be formed using the same material by a one-time patterning process. One of the first metal part SD1 and the second metal part SD2 may be the source S, and the other may be the drain D. Optionally, with reference to FIG. 6, the first metal part SD1 is shown as the drain D, and the second metal part SD2 is the source S.

Furthermore, the display panel may further include a second via K2 running through the insulating layer 03 and exposing the second metal part SD2. That is, an orthographic projection of the second via K2 on the substrate 01 overlays with an orthographic projection of the second metal part SD2 on the substrate 01. Exemplarily, with reference to FIG. 6, the orthographic projection of the second via K2 on the substrate 01 is within the orthographic projection of the second metal part SD2 on the substrate 01, so as to fully expose the second metal part SD2. The second conductive layer 041 in the anode layer 04 may be coupled with the second metal part SD2 by the second via K2. That is, the anode layer 04 may be electrically connected to the second metal part SD2 by the second conductive layer 041. In this way, the transistor T1 may transmit a drive voltage to the anode layer 04 through the second metal part SD2, and this drive voltage and the drive voltage applied to the cathode layer 06 may form a voltage difference to drive the light emitting layer 05 to emit light. Accordingly, the display panel may further include a cathode signal line for applying a voltage to the cathode layer 06.

Optionally, still with reference to FIG. 6, in the embodiments of the present disclosure, a width of the first via K1 may be greater than a width of the second via K2. A width direction is the direction parallel to the bearing surface of the substrate 01. In this way, the cathode layer 06 is reliably coupled with the auxiliary electrode 02 by the first via K1.

It should be noted that the display panel may further include a data line connected to the first metal part SD1 and a gate line G1 connected to the gate GT. FIG. 6 shows the gate line G1, which may be disposed on the same layer as the gate GT and spaced apart from each other. That is, the gate line G1 and the gate may be formed with the same material by a one-time patterning process. The gate line G1 may transmit a gate drive signal to the gate GT to drive the transistor T1 to be turned on. The transistor T1, in response to being turned on, transmits a drive voltage to the anode layer 05 connected to the second metal part SD2 based on a data signal supplied by the data line. Optionally, the gate GT and the gate line G1 may be made of a metal material such as aluminum, silver, molybdenum, or alloys thereof.

In addition, the display panel may further include a third via K3 running through the inter-layer dielectric layer ILD and exposing the active layer P1. The first metal part SD1 and the second metal part SD2 may be both coupled with the active layer P1 by the third via K3.

Optionally, the active layer P1 may be made of a semiconductor material such as polysilicon, amorphous silicon, or oxide semiconductor. The inter-layer dielectric layer ILD may be made of silicon dioxide, silicon nitride or a mixed material of silicon dioxide and silicon nitride.

It should be noted that the active layer P1 may have a semiconducting region (also referred to as a channel region) and a conductorized region on either side of the channel region (respectively referred to as a source region and a drain region). The semiconducting region may not be doped, or may be doped differently from the source region and the drain region, and thus have semiconductor characteristics. The conductorized region may be doped and thus electrically conductive. The doped impurity may vary depending on the type of the transistor (i.e., N-type or P-type). The above source-drain metal layer SD may be coupled with the conductorized region.

Optionally, with continued reference to FIG. 6, in the embodiment of the present disclosure, the active layer P1, the gate insulating layer G1, the gate metal layer GT, the inter-layer dielectric layer ILD and the source-drain metal layer SD may be stacked in sequence along the direction away from the substrate 01. That is, the transistor T1 shown in FIG. 6 may be a top-gate transistor.

Since the top-gate transistor has a short channel, its on-state current Ion is relatively large. Therefore, the display effect is significantly improved and the power consumption is effectively reduced. And, since the orthographic projections of the gate and the source and drain of the top-gate transistor on the substrate 01 have a small overlapping area and the resulting parasitic capacitance is small, the possibility of defects such as GDS is also reduced. The defect of GDS refers to dark spots will gradually grow once formed until the entire display surface fails (Growing Dark Spot).

On the basis of the top-gate transistor T1, still with reference to FIG. 6, the display panel may further include a light shielding layer 09 and a buffering layer 10 that are between the substrate 01 and the transistor T1 and laminated in sequence along the direction away from the substrate 01.

In addition, the display panel may further include a fourth via K4 running through the inter-layer dielectric layer ILD and the buffering layer 10 and exposing the light shielding layer 09. That is, an orthographic projection of the fourth via K4 on the substrate 01 overlays with an orthographic projection of the light shielding layer 09 on the substrate 01. Exemplarily, with reference to FIG. 6, the orthographic projection of the fourth via K4 on the substrate 01 is within the orthographic projection of the light shielding layer 09 on the substrate 01, so as to fully expose the light shielding layer 09. The second metal part SD2 may be coupled with the light shielding layer 09 by the fourth via K4. In this way, the voltage on the light shielding layer 09 may be the same as the voltage on the second metal part SD2 and the anode layer 05, thereby avoiding generation of parasitic capacitance between the light shielding layer 09 and other conductive structures.

Optionally, the light shielding layer 09 may be made of a metal material such as aluminum, silver, molybdenum or alloys thereof. An orthographic projection of the active layer P1 on the substrate 01 overlaps with an orthographic projection of the light shielding layer 09 on the substrate 01. The light shielding layer 09 may be configured to shield the active layer P1 to prevent the active layer P1 from the phenomenon of voltage threshold shift when exposed to light, and may be used for shading to prevent external light from interfering with the display of the display panel.

Optionally, the buffering layer 10 may be made of an inorganic material such as silicon nitride, silicon oxide or silicon oxynitride. The buffering layer 10 may be used for buffering between the transistor T1 and the substrate 01, and may prevent ions in the substrate 01 from entering the active layer P1, avoiding its performance from being affected after the ions enter the active layer P1.

Optionally, the substrate 01 may include a glass substrate or a flexible substrate. The flexible substrate may be made of polyimide. The cathode layer 06 may be made of indium zinc oxide (IZO). Accordingly, the cathode layer may also be referred to as an IZO layer. The light emitting layer 05 may be made of an organic electro-luminescent (EL) light emitting material.

Optionally, still with reference to FIG. 6, the substrate 01 according to the embodiment of the present disclosure may have a first region A1 and a second region B1 at least partially surrounding the first region A1. The first region A1 and the second region B1 may be defined by the pixel defining layer 08. Exemplarily, as shown in FIG. 6, the second region B1 is adjacent to the first region A1 and partially surrounds the first region A1.

On this basis, the light shielding layer 09, the transistor T1, the anode layer 04, the pixel defining layer 08, the second via K2, the third via K3 and the fourth via K4 may all be disposed in the first region A1. The auxiliary electrode 02, the first conductive layer 07 and the first via K1 may all be disposed in the second region B1. The buffering layer 09, the inter-layer dielectric layer ILD, the insulating layer 03, the light emitting layer 05 and the cathode layer 06 may all be disposed in the first region A1 and the second region B1. That is, some are disposed in the first region A1, and some are disposed in the second region B1. Moreover, the anode layer 04, the light emitting layer 05 and the cathode layer 06 disposed in the first region A1 form an organic light emitting diode.

Optionally, for a transparent display panel, the second region B1 may also be referred to as a transparent region. For this reason, a thickness of a part of the insulating layer 03 in the first region A1 may be greater than a thickness of a part in the second region B1 to ensure a better transparent display effect.

In summary, the embodiments of the present disclosure provide a display panel. The display panel includes an auxiliary electrode, an insulating layer, an anode layer, a light emitting layer, and a cathode layer that are on a side of a substrate and laminated in sequence. The insulating layer is provided with a via in the undercut shape and exposing the auxiliary electrode. In this way, the light emitting layer is reliably broken into two parts at an opening in a side, distal from the substrate 01, of the via, and then the cathode layer is effectively coupled with the auxiliary electrode along a side wall of a first part of the light emitting layer. On this basis, the voltage drop on the large and thin cathode layer is effectively reduced by flexibly adjusting the voltage applied to the auxiliary electrode to ensure better display uniformity of the display panel.

In addition, since the light emitting layer is broken by forming a via running through the insulating layer and in the undercut shape to facilitate the coupling of the cathode layer and the auxiliary electrode, it is considered that a rib structure is moved down from the anode layer to the insulating layer. Therefore, the rib structure does not need to be formed on the same layer as the anode layer. On this basis, it not only simplifies the manufacturing process, but also avoids dark spots caused by the thick anode layer as formed. Under the premise of ensuring good display uniformity, good product yield and display quality of the display panel are also ensured.

Figure 7:
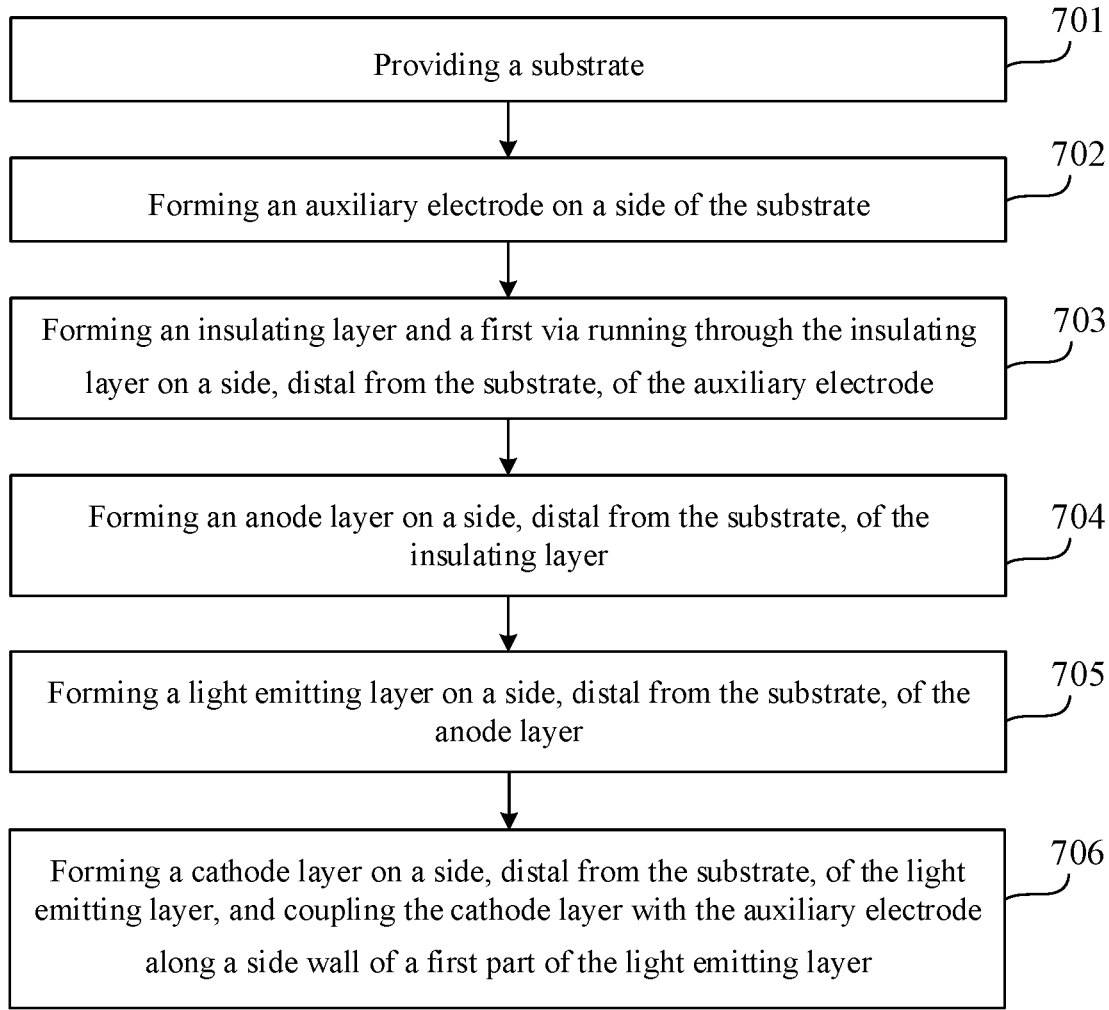
FIG. 7 is a flowchart of a method for manufacturing a display panel according to some embodiments of the present disclosure.

FIG. 7 is a flowchart of a method for manufacturing a display panel according to some embodiments of the present disclosure. The method may be applied to manufacture the display panel shown in FIG. 2, FIG. 4 or FIG. 6. As shown in FIG. 7, the method includes the following steps.

In step 701, a substrate is provided.

In step 702, an auxiliary electrode is formed on a side of the substrate.

In step 703, an insulating layer and a first via running through the insulating layer are formed on a side, distal from the substrate 01, of the auxiliary electrode.

With reference to FIG. 2 to FIG. 6, the first via K1 formed according to the embodiment of the present disclosure exposes the auxiliary electrode 02 and is in an undercut shape.

In step 704, an anode layer is formed on a side, distal from the substrate, of the insulating layer.

In step 705, a light emitting layer is formed on a side, distal from the substrate, of the anode layer.

With reference to FIG. 2 to FIG. 6, since the first via K1 is in the undercut shape, the light emitting layer 05 as formed is reliably broken at the opening in the side, distal from the substrate 01, of the first via K1 into the first part 051 and the second part 052. The first part 051 is outside the first via K1 and on the side, distal from the substrate 01, of the insulating layer 03. The second part 052 is inside the first via K1 and on the side, proximal to the substrate 01, of the insulating layer 03.

In step 706, a cathode layer is formed on a side, distal from the substrate 01, of the light emitting layer, and the cathode layer is coupled with the auxiliary electrode along a side wall of a first part of the light emitting layer.

With reference to FIGS. 2 to 6, the coupled part of the cathode layer 06 and the auxiliary electrode 02 is on the side, proximal t the substrate 01, of the anode layer 04. That is, the coupled part is more proximal to the substrate 01 relative to the anode layer 04.

Figure 8:
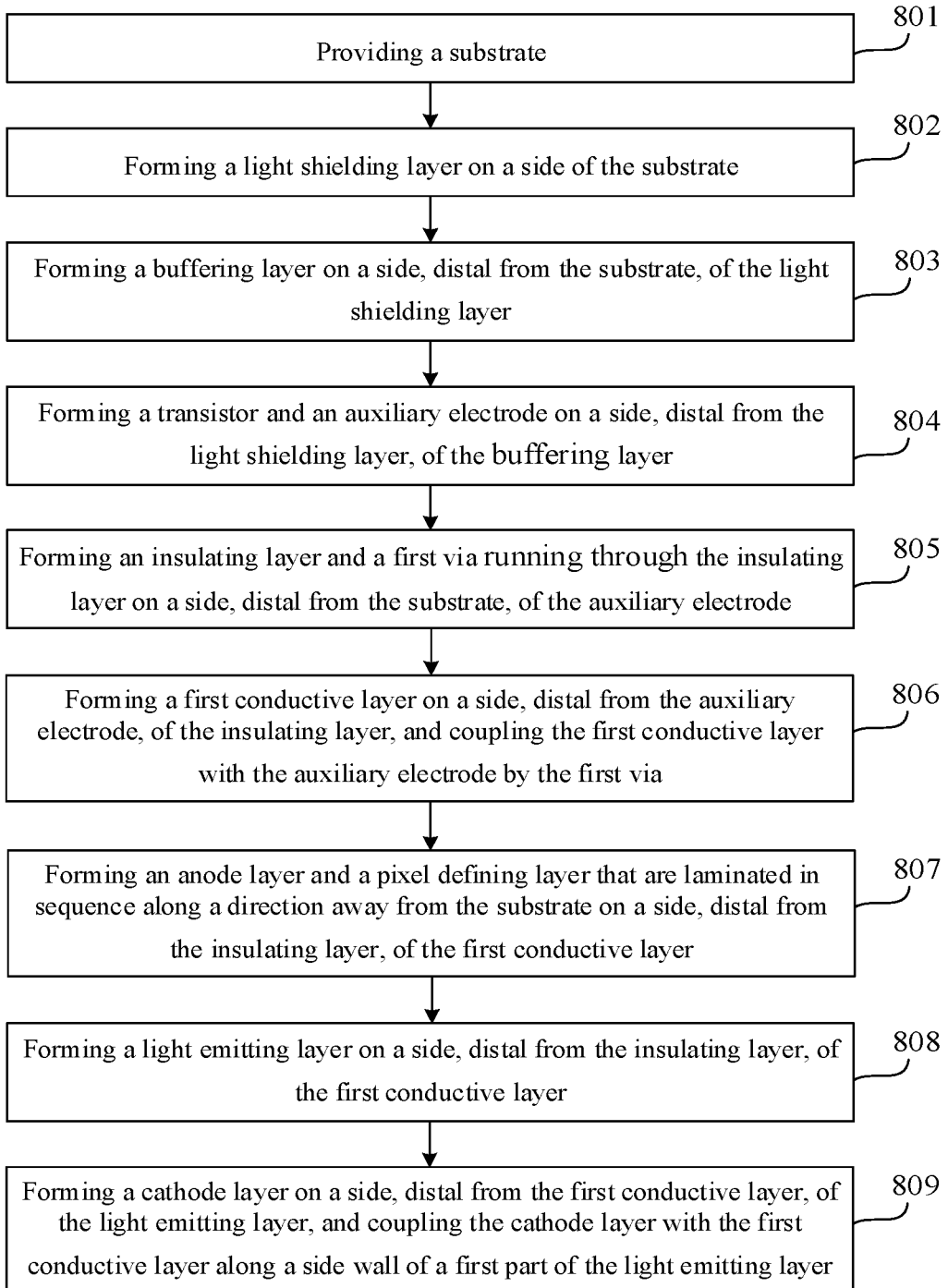
FIG. 8 is a flowchart of another method for manufacturing a display panel according to some embodiments of the present disclosure.

Taking the structure shown in FIG. 6 as an example, FIG. 8 shows a flowchart of another method for manufacturing a display panel. As shown in FIG. 8, the method may include the following steps.

In step 801, a substrate is provided.

Figure 9:
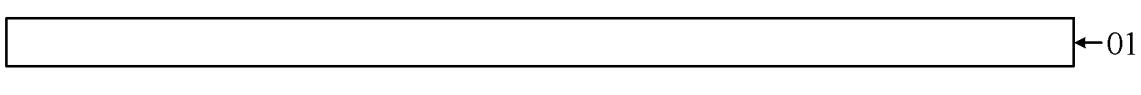
FIG. 9 is a schematic structural diagram of some film layers in a display panel according to some embodiments of the present disclosure.

Optionally, as mentioned in the above embodiments, the substrate 01 as provided may be a glass substrate or a flexible substrate. Exemplarily, FIG. 9 shows a schematic structural diagram of the substrate 01.

In step 802, a light shielding layer is formed on a side of the substrate.

Optionally, a light shielding material film may be formed on a side of the substrate and the light shielding layer may be formed by processing the light shielding material film by a one-time patterning process. As mentioned in the above embodiments, the light shielding material film may be made of a metal material.

Figure 10:
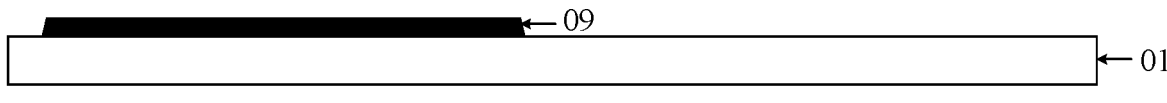
FIG. 10 is a schematic structural diagram of some film layers in another display panel according to some embodiments of the present disclosure.

In an exemplary embodiment, FIG. 10 shows a schematic structural diagram of the light shielding layer 09 formed on the substrate 01. In addition, with reference to FIG. 6, the light shielding layer 09 may be formed only in the first region A1 of the substrate 01.

In step 803, a buffering layer is formed on a side, distal from the substrate, of the light shielding layer.

Optionally, as mentioned in the above embodiments, the buffering layer may be formed by depositing an inorganic material such as silicon nitride, silicon oxide, or silicon oxynitride on the side, distal from the substrate, of the light shielding layer.

Figure 11:
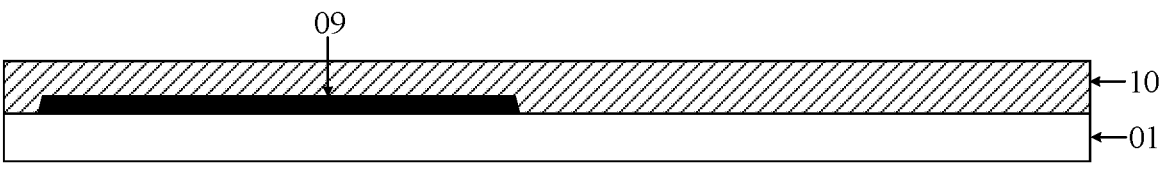
FIG. 11 is a schematic structural diagram of some film layers in still another display panel according to some embodiments of the present disclosure.

In an exemplary embodiment, FIG. 11 shows a schematic structural diagram of the buffering layer 10 formed on a side, distal from the substrate 01, of the light shielding layer 09. Furthermore, with reference to FIG. 6, the buffering layer 10 covering the entire substrate 01 may be formed in the first region A1 and the second region A2 of the substrate 01.

In step 804, a transistor and an auxiliary electrode are formed on a side, distal from the light shielding layer, of the buffering layer.

Figure 12:
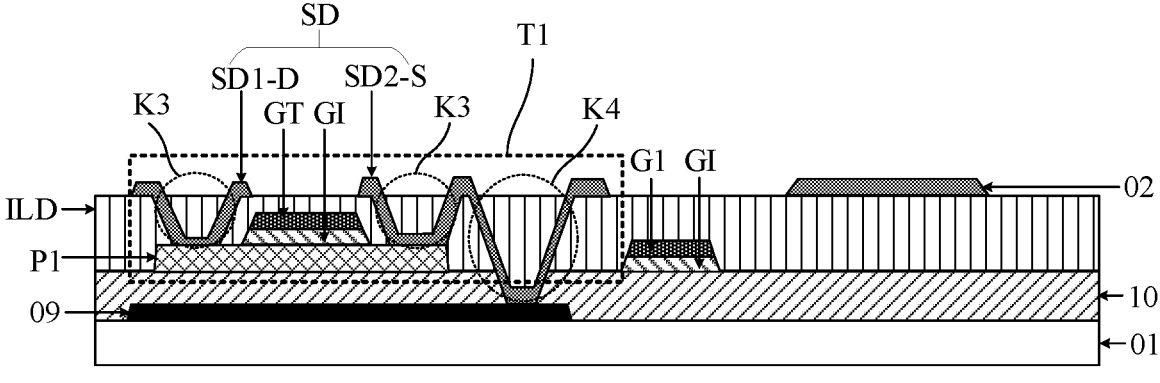
FIG. 12 is a schematic structural diagram of some film layers in yet still another display panel according to some embodiments of the present disclosure.

In an exemplary embodiment, FIG. 12 shows a schematic structural diagram of the transistor T1 and the auxiliary electrode 02 formed on a side, distal from the light shielding layer 09, of the buffering layer 10. Furthermore, with reference to FIG. 6, the transistor T1 may be formed in the first region A1 of the substrate 01, and the auxiliary electrode 02 may be formed in the second region A2 of the substrate 01.

With reference to FIG. 6, the transistor T1 as formed may include an active layer P1, a gate insulating layer G1, a gate metal layer GT, an inter-layer dielectric layer ILD and a source-drain metal layer SD laminated in sequence along the direction away from the substrate 01. The source-drain metal layer SD may include a first metal part SD1 and a second metal part SD2 that are disposed on the same layer and spaced apart from each other. One of the first metal part SD1 and the second metal part SD2 may be the source S, and the other may be the drain D. As shown in FIG. 12, the first metal part SD1 is the drain D, and the second metal part SD2 is the source S. Afterwards, with reference to FIG. 6, the first metal part SD1 and the second metal part SD2 may be coupled with the active layer P1 by the third via K3 running through the inter-layer dielectric layer ILD, and the second metal part SD2 may be coupled with the light shielding layer 09 by the fourth via K4 running through the inter-layer dielectric layer ILD and the buffering layer 10. Therefore, the third via K3 and the fourth via K4 need to be formed first.

Optionally, the third via K3 and the fourth via K4 may be respectively formed by subjecting the inter-layer dielectric layer ILD and the buffering layer 10 to an etching process. On the basis of FIG. 12, step 804 is described as follows.

First, an active material film may be formed on the substrate 01 on which the buffering layer 10 is formed, and the active layer P1 shown in FIG. 12 is formed by subjecting the active material layer to a one-time patterning process. Optionally, as mentioned in the above embodiments, the active material film may be made of a semiconductor material such as polysilicon, amorphous silicon, or oxide semiconductor.

Then, a gate insulating material film may be formed on the substrate 01 on which the active layer P1 is formed, and the gate insulating layer G1 shown in FIG. 12 is formed by subjecting the gate insulating material film to a one-time patterning process.

Afterwards, a gate metal material film may be formed on the substrate 01 on which the gate insulating layer G1 is formed, and the gate metal layer GT shown in FIG. 12 is formed by subjecting the gate metal material layer to a one-time patterning process. In addition, with reference to FIG. 12, the gate line G1 may also be formed together. Optionally, as mentioned in the above embodiments, the gate metal material film may be made of a metal material such as aluminum, silver, molybdenum, or alloys thereof.

Then, an inter-layer dielectric film may be formed on the substrate 01 on which the gate metal layer GT and the gate line G1 are formed, and the inter-layer dielectric layer ILD as shown in FIG. 12 is formed by subjecting the inter-layer dielectric layer to a one-time patterning process. Optionally, as mentioned in the above embodiments, the inter-layer dielectric film may be made of silicon dioxide, silicon nitride or a mixed material of silicon dioxide and silicon nitride.

Finally, a source-drain metal material film may be formed on the substrate 01 on which the inter-layer dielectric layer ILD is formed, and the source-drain metal layer SD shown in FIG. 12 may be formed by subjecting the source-drain metal material film to a one-time patterning process. In addition, the auxiliary electrode 02 may be formed at the same time. Optionally, as mentioned in the above embodiments, the source-drain metal material film may be made of a metal material such as aluminum, silver, molybdenum or alloys thereof.

That is, the completed transistor T1 and the auxiliary electrode 02 may be formed by multiple deposition and patterning processes on the substrate 01.

Step 805, an insulating layer and a first via running through the insulating layer are formed on a side, distal from the substrate, of the auxiliary electrode.

Optionally, with reference to FIG. 2 to FIG. 6, the first via K1 exposes the auxiliary electrode 02 and is in the undercut shape. Moreover, with reference to FIG. 3 to FIG. 6, the insulating layer 03 as formed may include a first insulating layer 031 and a second insulating layer 032 laminated in sequence along the direction away from the substrate 01. Accordingly, the first via K1 may include a first sub-via K11 running through the first insulating layer 031 and a second sub-via K12 running through the second insulating layer 032, wherein the first sub-via K11 and the second sub-via K12 are communicated in sequence along the direction away from the substrate 01.

On this basis, with reference to FIG. 13, step 805 may include the following steps.

In step 8051, a first insulating film is formed on the side, distal from the substrate, of the auxiliary electrode.

Optionally, the first insulating film may be formed by depositing an insulating material on the side, distal from the substrate, of the auxiliary electrode. As mentioned in the above embodiments, the insulating material used herein may be the material used to form the passivation layer PVX.

In an exemplary embodiment, FIG. 14 shows a schematic structural diagram of a first insulating film 031*m* formed on the side, distal from the substrate 01, of the auxiliary electrode 02. In addition, with reference to FIG. 6, the first insulating film 031*m* may be formed simultaneously in the first region A1 and the second region B1 of the substrate 01.

In step 8052, a second insulating film is formed on a side, distal from the auxiliary electrode, of the first insulating film.

Optionally, the second insulating film may be formed by depositing an insulating material on the side, distal from the auxiliary electrode 02, of the first insulating film 031*m* by deposition or coating. As mentioned in the above embodiments, the insulating material used herein may be a resin material. In addition, with reference to FIG. 6, the second insulating film may be formed simultaneously in the first region A1 and the second region B1 of the substrate 01.

In step 8053, a second insulating layer and a second sub-via running through the second insulating layer are formed by processing the second insulating film by a one-time patterning process.

Optionally, the second insulating layer and the second sub-via running through the second insulating layer are formed by processing the second insulating film by an exposure and patterning process using a halftone mask. In addition, with reference to FIG. 6, the second sub-via K12 may be formed only in the second region B1 of the substrate 01, and a cross-section of the second sub-via K12 is rectangular.

In an exemplary embodiment, with continued reference to FIG. 14, FIG. 14 also shows the second insulating layer 032 as formed and the second sub-via K12 running through the second insulating layer 032. With reference to FIG. 14, the second insulating film on the side, distal from the substrate 01, of the transistor T1 is completely reserved, only a thinned part of the second insulating film in the second region B1 (i.e., the transparent region) is reserved, and the second insulating film at the position where etching is required is completely removed, thereby forming the second insulating layer 032 with uneven thickness.

In some other embodiments, the second insulating layer and the second sub-via running through the second insulating layer may be formed by subjecting the second insulating film to an expose and patterning process with other types of masks.

In step 8054, a first insulating layer and a first sub-via running through the first insulating layer are formed by etching the first insulating film.

Optionally, the first insulating layer and the first sub-via running through the first insulating layer are formed by wet etching the first insulating film using an etching solution. Exemplarily, the etching solution may be hydrogen fluoride (HF). In some embodiments, the first insulating film may also be dry etched.

Figure 15:
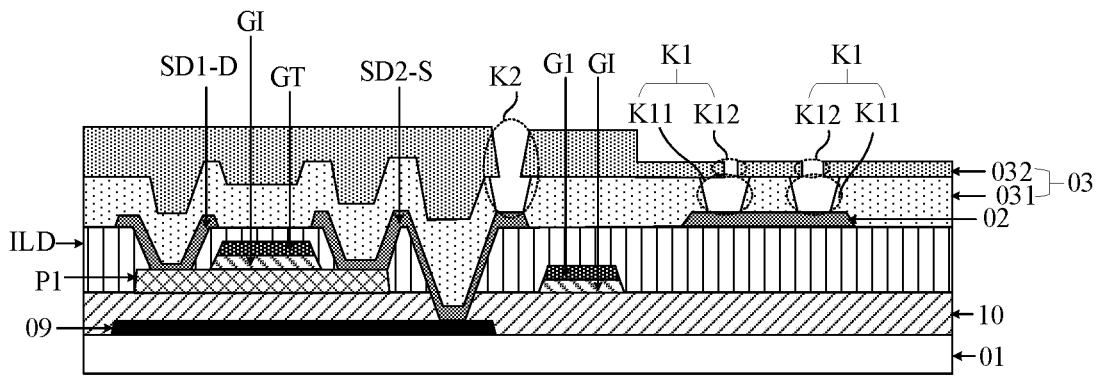
FIG. 15 is a schematic structural diagram of some film layers in yet still another display panel according to some embodiments of the present disclosure.

In an exemplary embodiment, FIG. 15 shows the first insulating layer 031 as formed and the first sub-via K11 running through the first insulating layer 031. With reference to FIG. 6, the first sub-via K11 may be formed only in the second region B1 of the substrate 01, and a cross-section of the first sub-via K11 is of an inverted trapezoid shape. Finally, an undercut rib structure with a tip angle of a specific length may be formed, and the rib structure includes the first insulating layer 031 having the first sub-via K11 and the second insulating layer 032 having the second sub-via K12.

In step 806, a first conductive layer is formed on a side, distal from the auxiliary electrode, of the insulating layer, and the first conductive layer is coupled with the auxiliary electrode by the first via.

Optionally, a first conductive material film may be formed on the substrate on which the insulating layer is formed, and the first conductive layer may be formed by subjecting the first conductive material film to a one-time patterning process. As mentioned in the above embodiments, the first conductive material film may be made of indium tin oxide (ITO).

Figure 16:
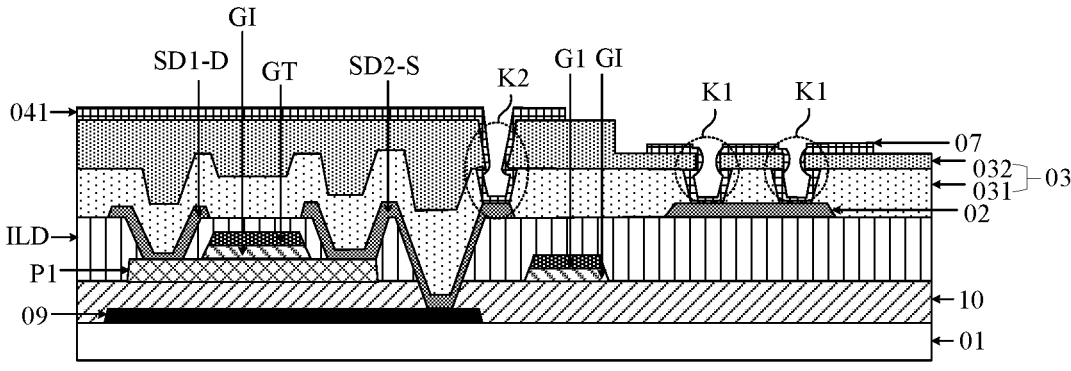
FIG. 16 is a schematic structural diagram of some film layers in yet still another display panel according to some embodiments of the present disclosure.

In an exemplary embodiment, FIG. 16 shows a schematic structural diagram of the first conductive layer 07 formed on the side, distal from the auxiliary electrode 02, of the insulating layer 03. With reference to FIG. 6, the first conductive layer 07 is formed in the first region A1 and the second region B1 of the substrate 01; and the first conductive layer 07 is coupled with the auxiliary electrode 02 along a side wall and bottom of the first via K1.

In step 807, an anode layer and a pixel defining layer that are laminated in sequence along the direction away from the substrate are formed on a side, distal from the insulating layer, of the first conductive layer.

Optionally, the anode layer and the pixel defining layer may be formed by subjecting the anode material film and the pixel defining material film to deposition, development, etching, and patterning. As mentioned in the above embodiments, the anode material film may be made of indium tin oxide (ITO). The pixel defining material film may be made of at least one of polymethylmethacrylate and polystyrene-based polymers, phenolic group-based polymers and derivatives, acrylic-based polymers, p-xylene-based polymers, aryl ether-based polymers, amide-based polymers, fluoride-based polymers, p-xylene-based polymers and vinyl alcohol polymers.

Figure 17:
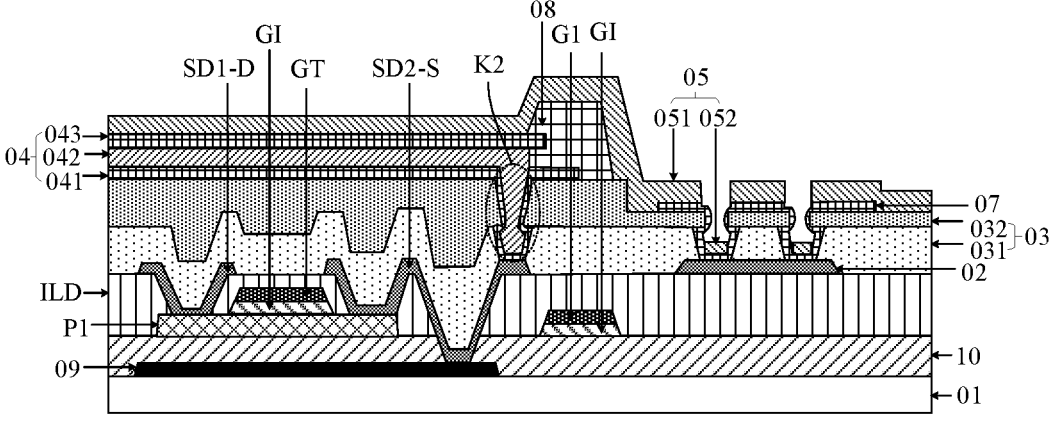
FIG. 17 is a schematic structural diagram of some film layers in yet still another display panel according to some embodiments of the present disclosure.

In an exemplary embodiment, FIG. 17 shows a schematic structural diagram of the anode layer 04 and the pixel defining layer 08 as formed. With reference to FIG. 6, the anode layer 04 and the pixel defining layer 08 may be formed only in the first region A1 of the substrate 01. Moreover, the anode layer 04 includes a second conductive layer 041, a reflective anode layer 042 and a third conductive layer 043 laminated in sequence along the direction away from the substrate 01. The second conductive layer 041 is coupled with the second metal part SD2 in the source-drain metal layer SD by the second via K2 running through the insulating layer 03. Therefore, the second via K2 running through the insulating layer 03 needs to be formed first. Optionally, with reference to FIGS. 15 and 16, while forming the first via K1, the second via K2 may be formed using the same process at the same time.

In step 808, a light emitting layer is formed on a side, distal from the insulating layer, of the first conductive layer.

Optionally, the light emitting layer may be formed by depositing a light emitting material on the side, distal from the insulating layer, of the first conductive layer by an evaporation process. As mentioned in the above embodiments, the light emitting material may include an EL light emitting material.

In an exemplary embodiment, FIG. 17 also shows a schematic structural diagram of the light emitting layer 05 as formed. With reference to FIG. 2 to FIG. 6, the light emitting layer 05 may be formed in the first region A1 and the second region B1 of the substrate 01. Moreover, since the insulating layer 03 has the first via K1 in the undercut shape, the light emitting layer 05 is reliably broken at the top opening of the first via K1 into the second part 052 inside the first via K1 and the first part 051 outside the first via K1.

In step 809, a cathode layer is formed on a side, distal from the first conductive layer, of the light emitting layer, and the cathode layer is coupled with the first conductive layer along a side wall of the first part of the light emitting layer.

Finally, the cathode layer may be formed by depositing or sputtering a cathode material on the side, distal from the first conductive layer, of the light emitting layer. As mentioned in the above embodiments, the cathode material may be indium zinc oxide IZO.

Figure 18:
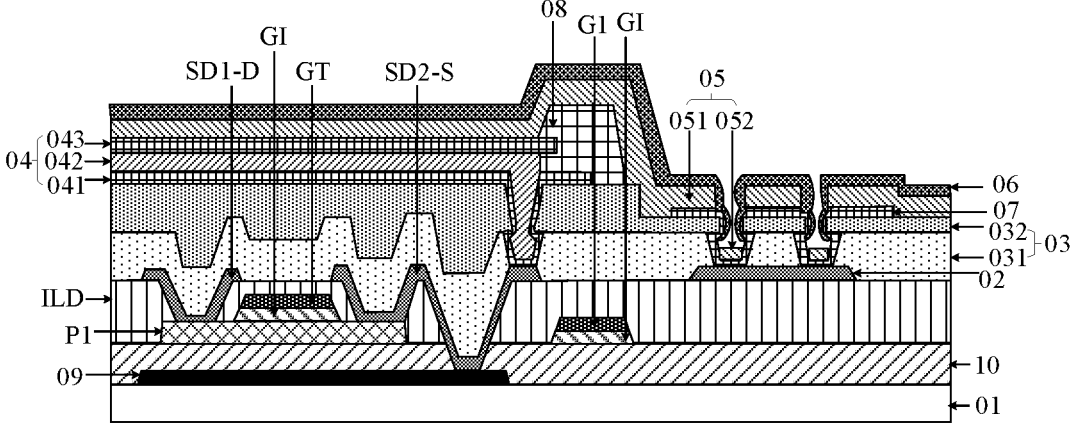
FIG. 18 is a schematic structural diagram of some film layers in yet still another display panel according to some embodiments of the present disclosure.

In an exemplary embodiment, FIG. 18 shows a schematic structural diagram of the cathode layer 06 as formed. With reference to FIG. 2 to FIG. 6, the cathode layer 06 may be formed in the first region A1 and the second region B1 of the substrate 01. On the basis of the breakage of the light emitting layer 05, the deposited cathode layer may diffuse into the first via K1 to be reliably coupled with the part of the first conductive layer 07 attached to the side wall of the first via K1 and finally coupled with the auxiliary electrode 02 reliably, thereby achieving the purpose of slowing down the voltage drop (IR drop) on the cathode layer.

It can also be seen with reference to the above steps 801 to 809 that the manufacturing method according to the embodiment of the present disclosure has a simple process flow and low cost, and the thickness of the finally formed reflective anode layer 042 is relatively thin, that is, the formed anode layer 04 is relatively thin. In this way, it is possible to greatly improve the problem of dark spots caused by particles in the reflective anode layer 042, such that the product yield of the display panel is better, and the display quality of the display panel is improved.

It should be noted that the sequence of steps in the method for manufacturing a display panel according to the embodiment of the present disclosure may be appropriately adjusted, and the steps may also be correspondingly increased or decreased according to circumstances. Exemplarily, step 802 may be canceled. Any method that can be easily conceived by any person skilled in the art within the technical scope disclosed in the present disclosure should be included in the protection scope of the invention, and thus will not be repeated here.

In summary, the embodiments of the present disclosure provide a method for manufacturing a display panel. In this method, an auxiliary electrode, an insulating layer, an anode layer, a light emitting layer, and a cathode layer that are laminated in sequence are formed on a side of a substrate, and a first via running through the insulating layer and in the undercut shape and exposing the auxiliary electrode is formed. In this way, the light emitting layer is reliably broken into two parts at an opening in a side, distal from the substrate, of the via, and then the cathode layer may be effectively coupled with the auxiliary electrode along a side wall of a first part of the light emitting layer. On this basis, the voltage drop on the large and thin cathode layer is effectively reduced by flexibly adjusting the voltage applied to the auxiliary electrode to ensure better display uniformity of the display panel.

In addition, since the light emitting layer is broken by forming a via running through the insulating layer and in the undercut shape to facilitate the coupling of the cathode layer and the auxiliary electrode, it is considered that a rib structure is moved down from the anode layer to the insulating layer. Therefore, the rib structure does not need to be formed on the same layer as the anode layer. On this basis, it not only simplifies the manufacturing process, but also avoids dark spots caused by the thick anode layer as formed. Under the premise of ensuring good display uniformity, good product yield and display quality of the display panel are also ensured.

Figure 19:
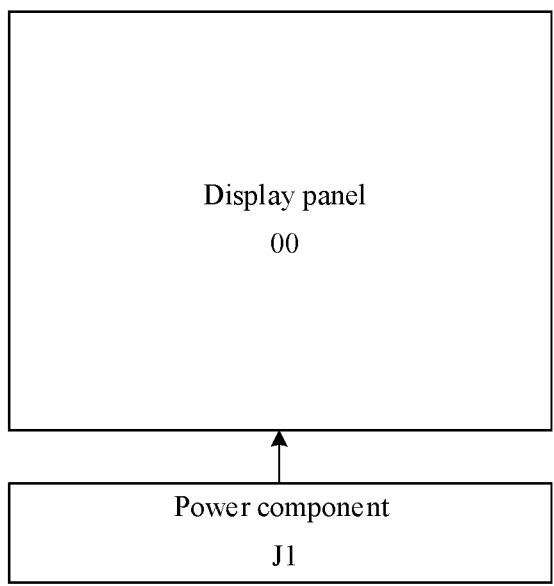
FIG. 19 is a schematic structural diagram of a display device according to some embodiments of the present disclosure.

FIG. 19 is a schematic structural diagram of a display device according to some embodiments of the present disclosure. As shown in FIG. 19, the display device may include a power component J1, and a display panel as shown in FIG. 2, FIG. 3, or FIG. 6.

The power component J1 may be electrically connected to the display panel 00 and configured to supply power to the display panel 00.

Optionally, the display device may be any product or component with a display function such as a mobile phone, a tablet computer, a television, a monitor, a notebook computer, a digital photo frame, a navigator, or a transparent display product. Transparent display products may be applied to vehicle displays such as automobiles or subways, and may also be applied to window displays such as hotels or clothing stores. The transparent display products have the advantages of clear image quality and realistic display effects.

It should be noted that in the drawings, the dimensions of layers and regions may be exaggerated for clarity of illustration. It should be further understood that when an element or layer is referred to as being "on" another element or layer, the element or layer directly on the other element or intervening layers may be present. Further, it will be understood that when an element or layer is referred to as being "under" another element or layer, the element or layer may be directly under the other element, or one or more intervening layers or elements may be present. In addition, it will also be understood that when a layer or element is referred to as being "between" two layers or elements, the element or layer may be the only layer between the two layers or elements, or one or more intervening layers or elements may also be present. Like reference numerals designate like elements throughout.

In addition, the terms used in the embodiments of the present disclosure are only used to explain the embodiments of the present disclosure, and are not intended to limit the present disclosure. Unless otherwise defined, the technical terms or scientific terms used in the embodiments of the present disclosure shall have common meanings understood by those skilled in the art to which the present disclosure belongs.

Exemplarily, in the embodiments of the present disclosure, the terms "first" and "second" are used for description purposes only, and cannot be understood as indicating or implying relative importance. The term "plurality" means two or more, unless otherwise clearly defined.

Likewise, the article like "a" or "an" does not denote a limitation in quantity, but indicates at least one element.

The terms such as "comprises" or "comprising" and similar terms mean that the elements or items listed before "comprises" or "comprising" include the elements or items listed after "comprises" or "comprising" and their equivalents, and do not exclude other elements or items.

The term "above," "below," "left," or "right" are only used to indicate relative positional relationship, and when the absolute position of the described object changes, the relative positional relationship may also change accordingly. The term "connected" or "coupled" means "electrically connected."

The term "and/or" means that there may be three relationships. For example, A and/or B may mean: A exists alone, A and B exist simultaneously, and B exists alone. The symbol "/" generally indicates an "or" relationship between the contextual objects.

Described above are merely exemplary embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A display panel, comprising:

a substrate;

an auxiliary electrode on a side of the substrate;

an insulating layer on a side, distal from the substrate, of the auxiliary electrode and a first via running through the insulating layer, the first via exposing the auxiliary electrode and being in an undercut shape;

an anode layer on a side, distal from the substrate, of the insulating layer;

a light emitting layer on a side, distal from the substrate, of the anode layer, the light emitting layer being broken at an opening in a side, distal from the substrate, of the first via into a first part and a second part, the first part being outside the first via and on the side, distal from the substrate, of the insulating layer, and the second part being inside the first via and on a side, proximal to the substrate, of the insulating layer; and a cathode layer on a side, distal from the substrate, of the light emitting layer, the cathode layer being coupled with the auxiliary electrode along a side wall of the first part of the light emitting layer, and the coupled part of the cathode layer and the auxiliary electrode being on a side, proximal to the substrate, of the anode layer.

2. The display panel according to claim 1, wherein the insulating layer comprises a first insulating layer and a second insulating layer that are laminated in sequence along a direction away from the substrate;

the first via in the undercut shape comprises a first sub-via running through the first insulating layer and a second sub-via running through the second insulating layer, the first sub-via and the second sub-via being communicated in sequence along the direction away from the substrate; and an orthographic projection of an opening in a side, proximal to the substrate, of the first sub-via on the substrate and an orthographic projection of an opening in a side, proximal to the substrate, of the second sub-via on the substrate are both within an orthographic projection of an opening in a side, distal from the substrate, of the first sub-via on the substrate.

3. The display panel according to claim 2, wherein a thickness of the first insulating layer is greater than a thickness of the anode layer and less than or equal to a thickness of the second insulating layer.

4. The display panel according to claim 3, wherein the thickness of the first insulating layer is 0.5 times to 1 time the thickness of the second insulating layer.

5. The display panel according to claim 2, wherein a slope of a side wall of the first sub-via is larger than a slope of a side wall of the second sub-via.

6. The display panel according to claim 5, wherein, along a direction perpendicular to the substrate, a cross-section of the first sub-via is of an inverted trapezoid shape, and a cross-section of the second sub-via is of a rectangle shape.

7. The display panel according to claim 2, wherein the first insulating layer comprises a passivation layer, and the second insulating layer comprises a resin material layer.

8. The display panel according to claim 1, further comprising: one first via running through the insulating layer; or, a plurality of first vias running through the insulating layer, wherein a direction in which the plurality of first vias are arranged at intervals is a direction parallel to a bearing surface of the substrate.

9. The display panel according to claim 1, further comprising:

a first conductive layer between the insulating layer and the light emitting layer, the cathode layer being coupled with the first conductive layer along the side wall of the first part of the light emitting layer, the first conductive layer being coupled with the auxiliary electrode along a side wall of the first via and a bottom of the first via, and the coupled part of the cathode layer and the first conductive layer being on the side, proximal to the substrate, of the anode layer.

10. The display panel according to claim 9, wherein the anode layer comprises a second conductive layer, a reflective anode layer, and a third conductive layer that are laminated in sequence along the direction away from the substrate;

wherein the second conductive layer and the first conductive layer are disposed on the same layer and spaced apart from each other.

11. The display panel according to claim 10, further comprising:

a transistor between the substrate and the insulating layer, the transistor being provided with an active layer, a gate insulating layer, a gate metal layer, an inter-layer dielectric layer, and a source-drain metal layer that are laminated in sequence, the source-drain metal layer and the auxiliary electrode being disposed on the same layer, and the source-drain metal layer comprising a first metal part and a second metal part that are disposed on the same layer and spaced apart from each other;

a second via running through the insulating layer and exposing the second metal part, the second conductive layer in the anode layer being coupled with the second metal part by the second via; and a third via running through the inter-layer dielectric layer and exposing the active layer, the first metal part and the second metal part being both coupled with the active layer by the third via.

12. The display panel according to claim 11, wherein a width of the first via is greater than a width of the second via.

13. The display panel according to claim 11, wherein the active layer, the gate insulating layer, the gate metal layer, the inter-layer dielectric layer, and the source-drain metal layer are laminated in sequence along the direction away from the substrate; and the display panel further comprises:

a light shielding layer and a buffering layer that are laminated in sequence along the direction away from the substrate between the substrate and the transistor; and a fourth via running through the inter-layer dielectric layer and the buffering layer and exposing the light shielding layer, the second metal part being coupled with the light shielding layer by the fourth via.

14. The display panel according to claim 13, wherein the display panel further comprises a pixel defining layer disposed between the insulating layer and the light emitting layer, and the substrate comprises a first region and a second region, wherein the first region and the second region are defined by the pixel defining layer, the second region at least partially surrounding the first region;

the light shielding layer, the transistor, the anode layer, the pixel defining layer, the second via, the third via, and the fourth via are all disposed in the first region;

the auxiliary electrode, the first conductive layer, and the first via are all disposed in the second region;

the buffering layer, the inter-layer dielectric layer, the insulating layer, the light emitting layer, and the cathode layer are all disposed in the first region and the second region, and a thickness of a part of the insulating layer disposed in the first region is greater than a thickness of a part of the insulating layer disposed in the second region; and the anode layer, the light emitting layer, and the cathode layer disposed in the first region form an organic light emitting diode.

15. A display device, comprising: a power component, and a display panel; wherein the power component is electrically connected to the display panel, and is configured to supply power to the display panel; and the display panel comprises:

a substrate;

an auxiliary electrode on a side of the substrate;

an insulating layer on a side, distal from the substrate, of the auxiliary electrode and a first via running through the insulating layer, the first via exposing the auxiliary electrode and being in an undercut shape;

an anode layer on a side, distal from the substrate, of the insulating layer;

a light emitting layer on a side, distal from the substrate, of the anode layer, the light emitting layer being broken at an opening in a side, distal from the substrate, of the first via into a first part and a second part, the first part being outside the first via and on the side, distal from the substrate, of the insulating layer, and the second part being inside the first via and on a side, proximal to the substrate, of the insulating layer; and a cathode layer on a side, distal from the substrate, of the light emitting layer, the cathode layer being coupled with the auxiliary electrode along a side wall of the first part of the light emitting layer, and the coupled part of the cathode layer and the auxiliary electrode being on a side, proximal to the substrate, of the anode layer.

16. The display device according to claim 15, wherein the insulating layer comprises a first insulating layer and a second insulating layer that are laminated in sequence along a direction away from the substrate;

the first via in the undercut shape comprises a first sub-via running through the first insulating layer and a second sub-via running through the second insulating layer, the first sub-via and the second sub-via being communicated in sequence along the direction away from the substrate; and an orthographic projection of an opening in a side, proximal to the substrate, of the first sub-via on the substrate and an orthographic projection of an opening in a side, proximal to the substrate, of the second sub-via on the substrate are both within an orthographic projection of an opening in a side, distal from the substrate, of the first sub-via on the substrate.

17. The display device according to claim 16, wherein a thickness of the first insulating layer is greater than a thickness of the anode layer and less than or equal to a thickness of the second insulating layer.

18. The display device according to claim 17, wherein the thickness of the first insulating layer is 0.5 times to 1 time the thickness of the second insulating layer.

19. The display device according to claim 16, wherein a slope of a side wall of the first sub-via is larger than a slope of a side wall of the second sub-via.

20. The display device according to claim 19, wherein, along a direction perpendicular to the substrate, a cross-section of the first sub-via is of an inverted trapezoid shape, and a cross-section of the second sub-via is of a rectangle shape.

* * * * *